(12) United States Patent
Pfau et al.

(10) Patent No.: US 8,552,746 B2
(45) Date of Patent: Oct. 8, 2013

(54) PROXIMITY SENSOR INCLUDING A MULTILAYER ELASTOMER ASSEMBLY

(75) Inventors: Douglas Allen Pfau, Canton, MI (US); James Frederick Krier, Grosse Pointe Woods, MI (US); David Michael Whitton, Saline, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 317 days.

(21) Appl. No.: 12/975,996

(22) Filed: Dec. 22, 2010

(65) Prior Publication Data

US 2012/0161795 A1 Jun. 28, 2012

(51) Int. Cl.
*G01R 27/26* (2006.01)

(52) U.S. Cl.
USPC .......................................... 324/679; 324/658

(58) Field of Classification Search
USPC .................. 324/658, 679, 686, 690
See application file for complete search history.

(56) References Cited

U.S. PATENT DOCUMENTS

| | | | |
|---|---|---|---|
| 3,971,610 A | 7/1976 | Buchoff et al. | |
| 5,788,516 A | 8/1998 | Uggmark | |
| 6,373,265 B1 | 4/2002 | Morimoto et al. | |
| 7,215,529 B2 | 5/2007 | Rosenau | |
| 2001/0011994 A1 | 8/2001 | Morimoto et al. | |
| 2005/0243064 A1 | 11/2005 | Morimoto et al. | |
| 2006/0244466 A1 | 11/2006 | Call et al. | |
| 2008/0011093 A1* | 1/2008 | Shank et al. | 73/780 |
| 2008/0202912 A1 | 8/2008 | Boddie et al. | |
| 2008/0211519 A1 | 9/2008 | Kurumado et al. | |
| 2009/0260897 A1 | 10/2009 | Kruse | |
| 2009/0314510 A1 | 12/2009 | Kukowski et al. | |
| 2010/0033196 A1 | 2/2010 | Hayakawa et al. | |
| 2010/0201650 A1 | 8/2010 | Son | |

OTHER PUBLICATIONS

A Combined Inductive-Capacitive Proximity Sensor and Its Application to Seat Occupancy Sensing; Boby George, Hubert Zangl, Thomas Bretterklieber and Georg Brasseur; Institute of Electrical Measurement and Measurement Signal Processing; 8010 Graz, Austria; Copyright 2009 IEEE.
Dielectric Elastomer Actuators for Tactile Displays; Marc Matysek, Peter Lotz, Thomas Winterstein, Helmut F. Schlaak; Technische Universitat Darmstadt, Institute for Electromechanical Design, Darmstadt, Germany; copyright 2009 IEEE.
An Elastometric Tactile Sensor Employment Dielectric Constant Variation and Applicable to Orthodontia; Fan-Gang Tseng, Chin-Sheng Yang, and Li-Chern Pan; ESS Dept., National Tsing Hua University; Dept. of Internal Medicine, Taipei Medical University, Taiwan ROC; copyright 2004 IEEE.
Automotive HMI redefined; Hassane El-Khoury; applications Engineer Staff, Cypress Semiconductor; Mar. 6, 2008 8:06 AM EST.

(Continued)

*Primary Examiner* — Vincent Q Nguyen
(74) *Attorney, Agent, or Firm* — Fraser Clemens Martin & Miller LLC; J. Douglas Miller

(57) ABSTRACT

A capacitive sensor includes a conductive elastomer portion formed into a pre-determined shape to sense a touch of a user within a sensing zone of the conductive elastomer portion, a dielectric portion disposed adjacent the conductive elastomer portion within the sensing zone of the conductive elastomer portion, and a controller in electrical communication with the conductive elastomer portion to detect a change in an electrical characteristic of the conductive elastomer portion.

9 Claims, 3 Drawing Sheets

(56) References Cited

OTHER PUBLICATIONS

Transparent Tactile Feeling Device for Touch-Screen Interface; Arai, Iwata, and Fukuda; Nagoya University, Dept.of Micro-Nano Systems Engineering; Furo-cho Chikusa; Nagoya, Japan; copyright 2004 IEEE.

Multi-Layer Embedment of Conductive and Non-Donductive PDMS for All-Elastomer Mems; Engel, Chen, Ryu, Pandya, Tucker, Yang, Liu; Micro Actuators, Sensors, and Systems Group, University of Illinois at Urbana-Champaign; Urbana, IL USA; date unknown, Feb. 24, 2011.

Capacitive Sensing; The Molex Advantage; Molex 1750 County Farm Road; Naperville, IL 60563 USA; copyright 2008, Molex.

* cited by examiner

PROXIMITY SENSOR INCLUDING A MULTILAYER ELASTOMER ASSEMBLY

FIELD OF THE INVENTION

The present invention relates generally to a proximity sensor. In particular, the invention is directed to a multi-layer proximity sensor.

BACKGROUND OF THE INVENTION

Automotive display control panel technology is moving from traditional non-interactive displays and mechanical switches to touch-sensitive screens and electronic sensing switches. One type of sensing switch is commonly referred to as a capacitive sensing switch. The capacitive sensing switch typically includes an electrode adapted to create an electric field adjacent thereto which generally defines a sensing zone. The electrode is coupled to a rear surface of a non-electrically conductive or a low-electrically conductivity panel, wherein the electrode is in electrical communication with sensing circuitry or a controller. When a conductive or a charged object such as a finger of a person, for example, is placed within the sensing zone on a front surface of the panel, the finger interacts with the electrical field and changes the capacitance of the electrode. The changed capacitance is detected by the sensing circuitry, indicating the occurrence of a switching event.

Electrically conductive panels are known to spread the electrical field from the electrode which reduces the sensitivity of the capacitive sensing switch within the desired sensing zone. Further, spreading the electric field extends the overall area of the sensing zone of the capacitive sensing switch which can result in undesirable switching performance. This is also present with the use of electrically conductive decorative finishes disposed on a surface of a control panel.

It is often desired to use the capacitive sensing switch with electrically conductive panels or panels having electrically conductive decorative finishes thereon. For example, electrically conductive decorative finishes are often employed with control panels to provide a desired aesthetic appearance to a passenger compartment for an automobile. When such electrically conductive decorative finishes have been used, the spreading of the electrical field of the electrode has been reduced by electrically isolating the portion of the panel within the sensing zone from the remainder of the panel and grounding the remainder of the panel. However, electrically isolating the portion of the panel within the sensing zone can cause unwanted performance characteristics in the capacitive sensing switch and produce an unwanted aesthetic appearance on the front surface of the panel.

The current method for adding capacitive sensing to a user interface surface requires several discrete parts. For example, a metal or conductive piece is typically secured to the rear of a traditional user interface (button) and a dedicated electrical interface provides electrical communication to a circuit board that contains the requisite electronic circuits and microcontrollers.

It would be desirable to develop a proximity sensor including a conductive elastomer portion and a non-conductive elastomer portion cooperating to sense a touch of a user, wherein the proximity sensor represents a plurality of controlled trigger events.

SUMMARY OF THE INVENTION

Concordant and consistent with the present invention, a proximity sensor including a conductive elastomer portion and a non-conductive elastomer portion cooperating to sense a touch of a user, wherein the proximity sensor represents a plurality of controlled trigger events, has surprisingly been discovered.

In one embodiment, a capacitive sensor comprises: a conductive elastomer portion formed into a pre-determined shape to sense a touch of a user within a sensing zone of the conductive elastomer portion; a dielectric portion disposed adjacent the conductive elastomer portion within the sensing zone of the conductive elastomer portion; and a controller in electrical communication with the conductive elastomer portion to detect a change in an electrical characteristic of the conductive elastomer portion.

In another embodiment, a capacitive sensor comprises: a non-conductive elastomer portion formed into a pre-determined shape; a conductive elastomer portion disposed adjacent at least a portion of the non-conductive elastomer portion to sense a touch of a user within a sensing zone of the conductive elastomer portion; a switch disposed adjacent a surface of the non-conductive elastomer portion; and a controller in electrical communication with the conductive elastomer portion and the switch, wherein the controller detects a change in an electrical characteristic of the conductive elastomer portion, and wherein the controller detects a state of the mechanical switch.

In yet another embodiment, an interface system comprises: a capacitive sensor including a non-conductive elastomer portion formed into a pre-determined shape and a conductive elastomer portion disposed adjacent at least a portion of the non-conductive elastomer portion to sense a touch of a user within a sensing zone of the conductive elastomer portion; a vehicle system for generating a feedback to the user; and a controller in electrical communication with the conductive elastomer portion to detect a change in an electrical characteristic of the conductive elastomer portion, wherein the controller configures the feedback generated by the vehicle system in response to the change in an electrical characteristic of the conductive elastomer portion.

BRIEF DESCRIPTION OF THE DRAWINGS

The above, as well as other advantages of the present invention, will become readily apparent to those skilled in the art from the following detailed description of the preferred embodiment when considered in the light of the accompanying drawings in which.

DETAILED DESCRIPTION OF EXEMPLARY EMBODIMENTS OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
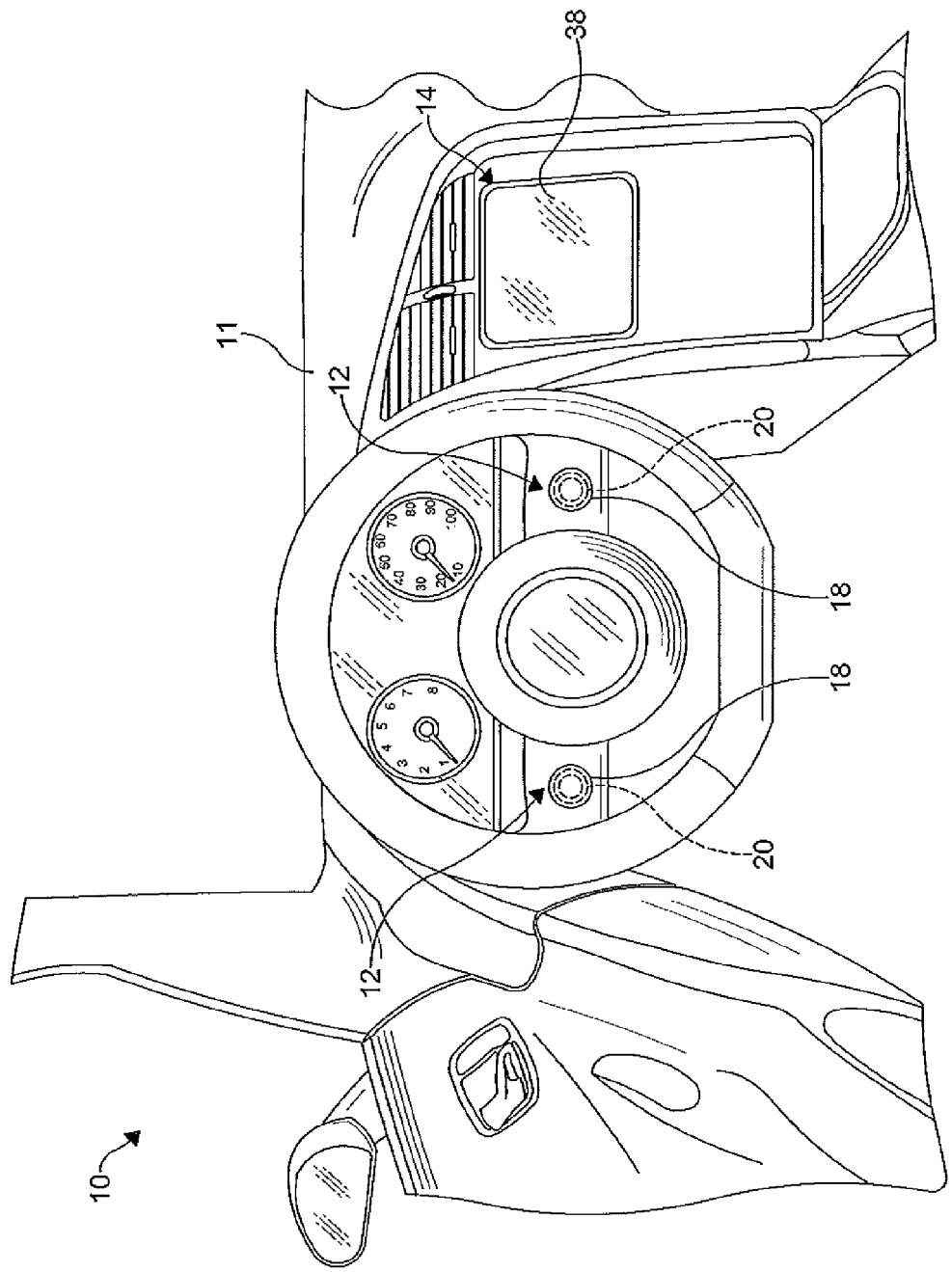
FIG. 1 is a perspective view of an interface system disposed in a vehicle according to an embodiment of the present invention.
Figure 2:
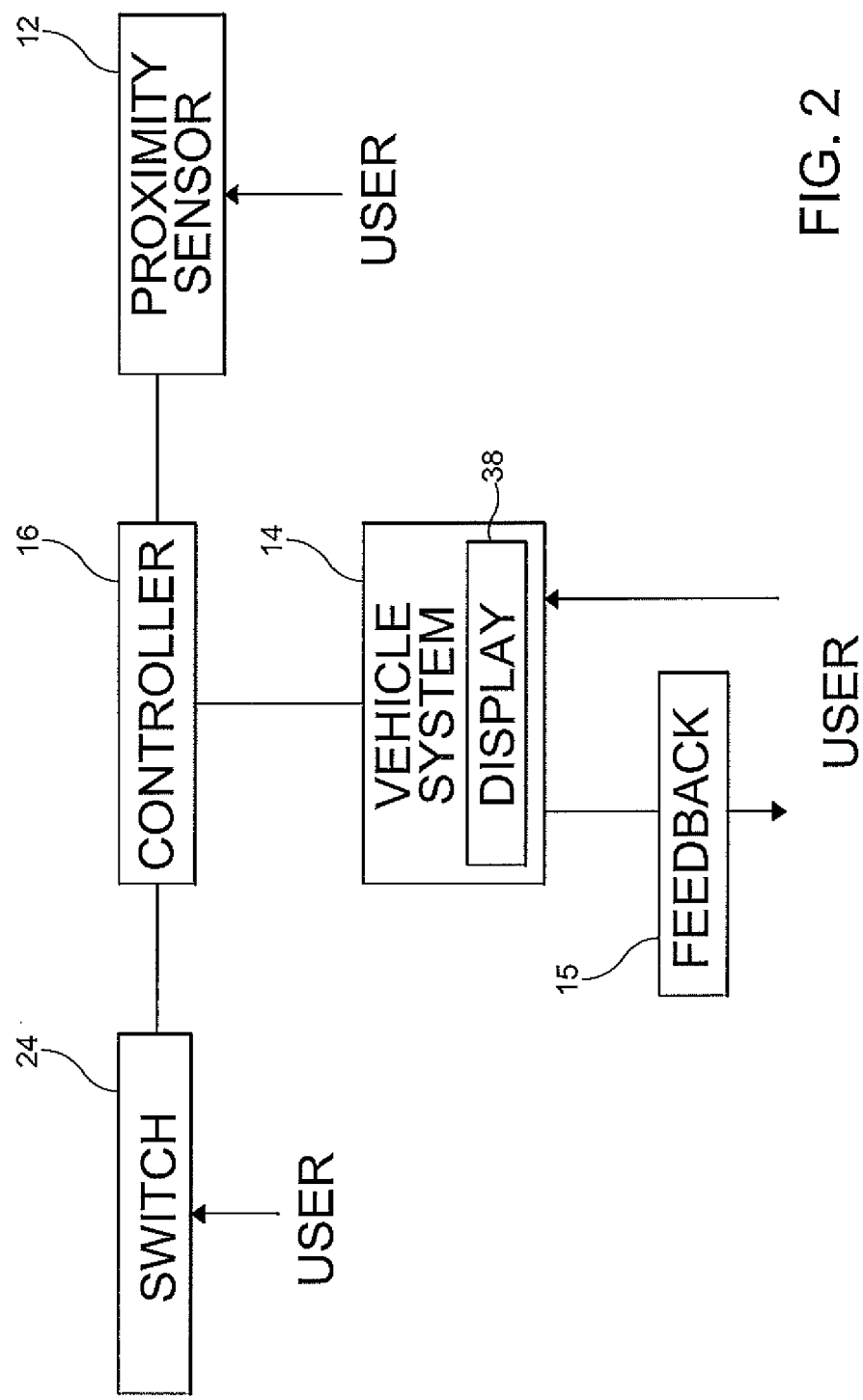
FIG. 2 is a schematic block diagram of the interface system of FIG. 1.
Figure 3:
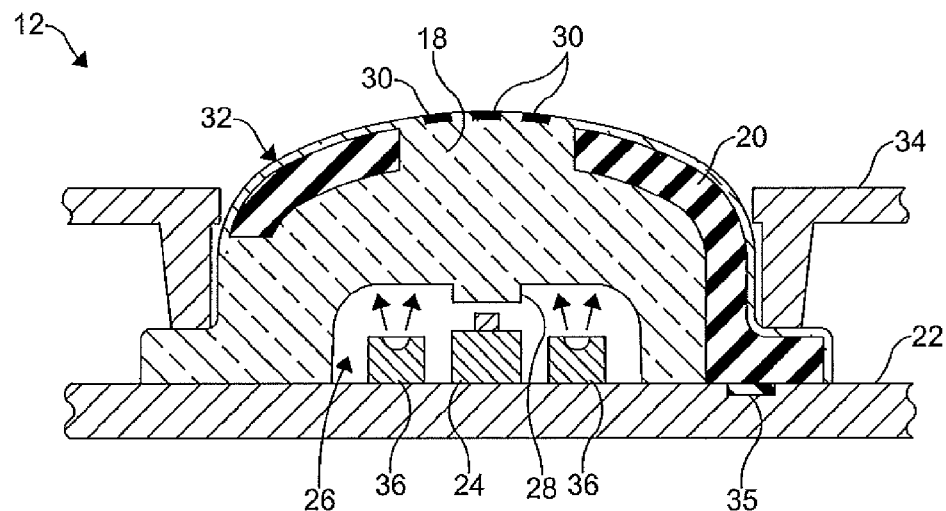
FIG. 3 is an enlarged fragmentary cross-sectional view of a proximity switch of the interface system of FIG. 1 according to an embodiment of the present invention.

FIGS. 1-3 illustrate an interface system 10 integrated with a vehicle 11 according to an embodiment of the present invention. However, it is understood that the interface system 10 can be disposed in non-vehicle environments. As shown, the interface system 10 includes a proximity sensor 12, a vehicle system 14 for generating a feedback 15 to a user, and a controller 16 in electrical communication with the proximity sensor 12 to detect a change in an electrical characteristic of the proximity sensor 12 and to configure the feedback 15 generated by the vehicle system 14 in response to the change in an electrical characteristic of the proximity sensor 12.

In the embodiment shown, the proximity sensor 12 includes a non-conductive elastomer portion 18 formed into a pre-determined shape, a conductive elastomer portion 20 disposed adjacent at least a portion of the non-conductive elastomer portion 18, a circuit board 22 in electrical communication with the conductive elastomer portion 20, and a switch 24 disposed adjacent a portion of at least one of the non-conductive elastomer portion 18 and the conductive elastomer portion 20. It is understood that the proximity sensor 12 can be integrated with any portion, surface, or part of the vehicle 11. It is further understood that any number of the proximity sensors 12 can be used.

The non-conductive elastomer portion 18 is typically formed into a substantially semi-spherical shape having a cavity 26 formed therein. However, it is understood that the non-conductive elastomer portion 18 can have any size and shape. As a non-limiting example the non-conductive elastomer portion 18 is transparent or translucent to allow light to pass therethrough. It is understood that a translucent elastomer can be used to diffract light passing through the non-conductive elastomer portion 18. However, any level of transparency can be used. As a further non-limiting example, the non-conductive elastomer portion 18 includes a protuberance 28 formed on an inner surface of the non-conductive elastomer portion 20 which defines the cavity 26. Accordingly, the protuberance 28 can be positioned in alignment with the switch 24 to selectively abut a portion of the switch 24 upon deformation of the non-conductive elastomer portion 18.

In certain embodiments, a portion of the non-conductive elastomer portion 18 includes a decorative finish 30 including graphics, indicia, or the like. As a non-limiting example, the decorative finish 30 is formed adjacent a first surface 32 (e.g. a contact surface, a user-engageable surface, a front surface) of the non-conductive elastomer portion 18. It is understood that the decorative finish 30 can be formed from any material to visual present a graphical identifier to a user. As a further non-limiting example, a decorative film (not shown) or paint can be applied to the first surface 32 of the non-conductive elastomer portion 18 to create the decorative finish 30. It is further understood that the decorative finish 30 can represent a function associated with the proximity sensor 12.

The conductive elastomer portion 20 is disposed adjacent a portion of the non-conductive elastomer portion 18 and in electrical communication with the controller 16. In certain embodiments, the conductive elastomer portion 20 is disposed adjacent the first surface 32 of the non-conductive elastomer portion 18, wherein a portion of the first surface 32 of the non-conductive elastomer portion 18 is disposed within a sensing zone (e.g. an electric field) of the conductive elastomer portion 18, as appreciated by one skilled in the art of proximity sensors. As a non-limiting example, a portion of the non-conductive elastomer portion 18 is configured on the conductive elastomer portion 20 to provide a dielectric barrier between a finger of the user and the conductive elastomer portion 20. It is understood that other dielectric materials can be applied to the conductive elastomer portion 20 to provide a dielectric barrier for proximity sensing, as appreciated by one skilled in the art. It is understood that the conductive elastomer portion 20 can have any size and shape.

In certain embodiments, the conductive elastomer portion 20 is arranged with the non-conductive elastomer portion 18 to create a plurality of "sensing zones" on a particular surface or part of the vehicle 11. It is understood that a plurality of distinct sections of the conductive elastomer portion 20 can be spaced from one another and electrically isolated by the non-conductive elastomer portion 18 (or dielectric material) in order to provide multiple separate and distinct "sensing zones" for controlling various functions. It is further understood that the conductive elastomer portion 20 can have any arrangement to create any number of the "sensing zones".

The circuit board 22 is typically disposed adjacent at least one of the non-conductive elastomer portion 18 and the conductive elastomer portion 20 and in electrical communication with the conductive elastomer portion 20 and the controller 16. However, the circuit board 22 can be spaced from at least one of the non-conductive elastomer portion 18 and the conductive elastomer portion 20 and in electrical communication with the conductive elastomer portion 20 by an electrical interface (not shown). It is understood that the circuit board 22 can provide electrical intercommunication between the conductive elastomer portion 20 and at least one of the controller 16 and a source of electrical energy (not shown). It is further understood that the circuit board 22 can include control elements and protection elements to manage the electrical characteristics of the interface system 10.

In certain embodiments, the conductive elastomer portion 20 abuts a conductive portion of the circuit board 22 to provide electrical intercommunication between the conductive elastomer portion 20 and the circuit board 22. As a non-limiting example, a clamping element 34 (e.g. a housing) is disposed adjacent at least one of the non-conductive elastomer portion 18 and the conductive elastomer portion 20 to secure the conductive elastomer portion 20 in direct contact with a conductive portion 35 of the circuit board 22. It is understood that the direct contact between the conductive elastomer portion 20 and the conductive portion 35 of the circuit board 22 alleviates the requirement for a separate electrical interconnect device. However, it is understood that any means for electrical interconnection can be used to electrically couple the conductive elastomer portion 20 to the controller 16 and/or the circuit board 22.

The switch 24 is typically a mechanically-actuated switch such as a push-button switch configured to generate an electrical signal in response to a toggling of the switch 24. However, other switches (e.g. electro-mechanical switches) can be used. As a non-limiting example, the switch 24 is disposed in the cavity 26 formed in the non-conductive elastomer portion 18. As a further non-limiting example, the switch 24 is in electrical communication with the controller 16 (e.g. via the circuit board 22). In certain embodiments, the switch 24 is coupled to the circuit board 22 to secure the switch 24 in a substantially static position relative to the non-conductive elastomer portion 18.

In certain embodiments, the interface system 10 further includes at least one light source 36 disposed to illuminate a portion of the proximity sensor 12. As a non-limiting example, the at least one light source 36 is disposed in the cavity 26 formed in the non-conductive elastomer portion 18 and configured to emit light rays though the non-conductive elastomer portion 18. As a further non-limiting example, the at least one light source 36 is in electrical communication with the circuit board 22 to be selectively energized by a source of electrical energy (not shown).

The vehicle system 14 is typically a user interface including a display 38 for presenting a visible output (e.g. the feedback 15) to the user. It is understood that any number of the displays 38 can be used, including one. It is further understood that any type of display can be used such as a two dimensional display, a three dimensional display, a touch screen, and the like. In certain embodiments, the vehicle system 14 is configured to provide at least one of an audible feedback, a haptic feedback, and a visual feedback to the user.

The controller 16 is in electrical communication with the proximity sensor 12 (e.g. the conductive elastomer portion 20) and the vehicle system 14 to detect a change in an electrical characteristic (e.g. capacitance) of the proximity sensor 12 and to configure the feedback 15 generated by the vehicle system 14 in response to the change in the electrical characteristic of the proximity sensor 12.

In certain embodiments, the controller 16 provides electrical energy to the conductive elastomer portion 20 to create an electric field adjacent thereto (i.e. the sensing zone). Further, the controller 16 is configured to detect changes in the electrical characteristic (e.g. capacitance) of the conductive elastomer portion 20, wherein the changed electrical characteristic indicates the presence of a conductive member (e.g. a human finger) within the sensing zone of the conductive elastomer portion 20. As a non-limiting example, the controller 16 can be configured to trigger a first event in response to the change in the electrical characteristic of the conductive elastomer portion 20 exceeding a first threshold. It is understood that the first threshold can be pre-defined to represent a non-touch threshold change in the capacitance of the conductive elastomer portion 20. As a further non-limiting example, the controller 16 can be configured to trigger a second event in response to the change in the electrical characteristic of the conductive elastomer portion 20 exceeding a second threshold. It is understood that the second threshold can be pre-defined to represent a touch threshold change in the capacitance of the conductive elastomer portion 20 experienced when a user contacts the first surface 32 (e.g. dielectric layer) of the proximity sensor 12. As a further non-limiting example, the controller 16 can be configured to trigger a third event in response to the change in state of the switch 24.

In use, multiple triggering events are available to the user in a single region of the interface system 10. Specifically, as a finger of the user enters the sensing zone of the proximity sensor 12 the electrical characteristic (e.g. capacitance) of the conductive elastomer portion 20 changes and the controller 16 executes a pre-determined first trigger event. As a non-limiting example, the first trigger event can include emphasizing or highlighting a portion of the visual output (e.g. the feedback 15) presented by the display 38. As a further non-limiting example, the decorative finish 30 of the proximity sensor 12 may represent a particular function associated with the vehicle system 14 such a volume control of a radio. Accordingly, when the finger of the user enters the sensing zone of the proximity sensor 12, the display 38 of the vehicle system 14 indicates to the user that his/her finger is within the sensing zone of a proximity sensor 12 by manipulating the feedback 15 presented to the user (e.g. highlighting a visual output representing a volume control). It is understood that the controller 16 can configure any system in response to the first trigger event.

Once the finger of the user contacts the first surface 32 of the proximity sensor 12, the controller 16 executes a pre-determined second trigger event. As a non-limiting example, when the user contacts the first surface 32 of the proximity sensor 12, the controller 16 configures the vehicle system 14 in a manner consistent with the decorative finish 30 presented to the user. Specifically, when the decorative finish 30 represents a volume control of a radio, the user can contact the first surface 32 of the proximity sensor 12 to cause the volume of the radio to increase or decrease. It is understood that the controller 16 can configure any system in response to the second trigger event.

Further, the user can apply a force to the first surface 32 of the proximity sensor 12 sufficient to depress (i.e. deform) the non-conductive elastomer portion 18. Accordingly, the non-conductive elastomer portion 18 is deformed and a portion (e.g. the protuberance 28) of the non-conductive elastomer portion 18 engages the switch 24 to toggle a state of the switch 24. In response to the change in state of the switch 24, the controller 16 executes a pre-determined third trigger event. As a non-limiting example, when the user depresses the first surface 32 of the proximity sensor 12, the controller 16 configures the vehicle system 14 in a manner consistent with the decorative finish 30 presented to the user. Specifically, when the decorative finish 30 represents a volume control of a radio, the user can depress the first surface 32 of the proximity sensor 12 to cause the volume of the radio to immediately mute. It is understood that the controller 16 can configure any system in response to the third trigger event. It is further understood that the proximity sensor 12 and the controller 16 can be configured to provide any number of triggering events based upon any number of thresholds relating to at least one of the change in the electrical characteristic of the proximity sensor 12 and a change in the state of the switch 24.

Figure 4:
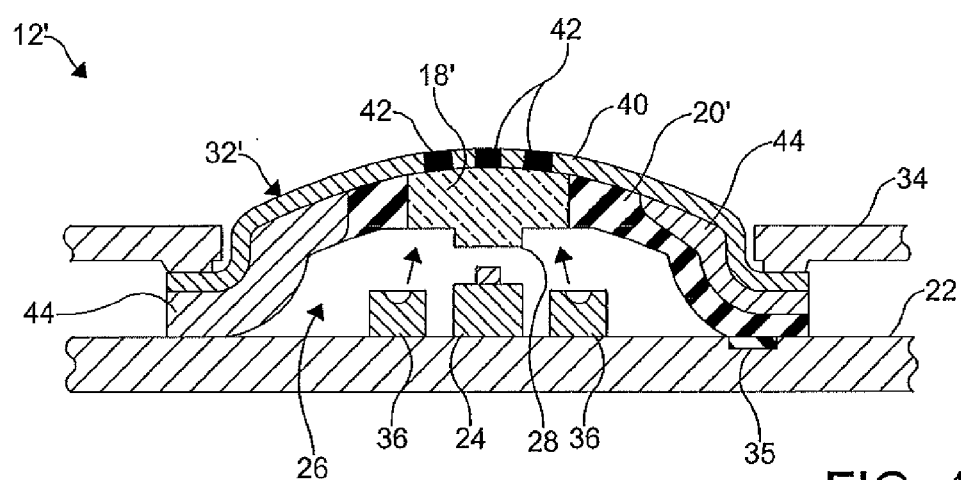
FIG. 4 is an enlarged fragmentary cross-sectional view of a proximity switch according to another embodiment of the present invention.

FIG. 4 illustrates a proximity sensor 12' according to another embodiment of the present invention similar to the proximity sensor 12, except as described below. As shown, the proximity sensor 12' includes a non-conductive elastomer portion 18' formed into a pre-determined shape and a conductive elastomer portion 20' disposed adjacent at least a portion of the non-conductive elastomer portion 18'. It is understood that the proximity sensor 12' can be integrated with any portion, surface, or part of the vehicle 11. It is further understood that any number of the proximity sensors 12' can be used.

The non-conductive elastomer portion 18' is typically has a curved contour defining a cavity 26 between the circuit board 22 and the non-conductive elastomer portion 18'. However, it is understood that the non-conductive elastomer portion 18' can have any size and shape. As a non-limiting example the non-conductive elastomer portion 18' is transparent or translucent to allow light to pass therethrough. It is understood that a translucent elastomer can be used to diffract light passing through the non-conductive elastomer portion 18'. However, any level of transparency can be used. As a further non-limiting example, the non-conductive elastomer portion 18' includes a protuberance 28 extending from an inner surface of the non-conductive elastomer portion 18' defining the cavity 26. Accordingly, the protuberance 28 can be positioned in alignment with the switch 24 to selectively abut a portion of the switch 24 upon deformation of the non-conductive elastomer portion 18'.

The conductive elastomer portion 20' is disposed adjacent a portion of the non-conductive elastomer portion 18' and in electrical communication with the controller 16. As a non-limiting example, a portion of non-conductive elastomer portion 18' is configured on the conductive elastomer portion 20' to provide a dielectric barrier between a finger of the user and the conductive elastomer portion 20'.

As a further non-limiting example, a dielectric film 40 is configured on the conductive elastomer portion 20' to provide a dielectric barrier between a finger of the user and the conductive elastomer portion 20'. As shown, the dielectric film includes a decorative element 42 including graphics, indicia, or the like. As a non-limiting example, the dielectric film 40 provides a contact surface 32' (i.e. a user-engageable surface, a front surface) of the proximity sensor 12'. It is understood that the decorative element 42 can be formed from any material to visual present a graphical identifier to a user. It is further understood that the decorative element 42 can represent a function associated with the proximity sensor 12'. It is understood that other dielectric materials can be applied to the conductive elastomer portion 20' to provide a dielectric barrier for proximity sensing, as appreciated by one skilled in the art. It is understood that the conductive elastomer portion 20' can have any size and shape.

In certain embodiments, a support structure 44 is disposed to provide support to the decorative film 40. As a non-limiting example, the support structure 44 is coupled to at least one of the non-conductive elastomer portion 18' and the conductive elastomer portion 20' to support a desired shaped of the proximity sensor 12'. It is understood that any structure formed from any material having any size and shape can be used.

In certain embodiments, the conductive elastomer portion 20' is arranged with the non-conductive elastomer portion 18' to create a plurality of "sensing zones" on a particular surface or part of the vehicle 11. It is understood that a plurality of distinct sections of the conductive elastomer portion 20' can be spaced from one another and electrically isolated by the non-conductive elastomer portion 18' (or dielectric material) in order to provide multiple separate and distinct "sensing zones" for controlling various functions. It is further understood that the conductive elastomer portion 20' can have any arrangement to create any number of the "sensing zones".

In certain embodiments, the conductive elastomer portion 20' abuts a conductive portion of the circuit board 22 to provide electrical intercommunication between the conductive elastomer portion 20' and the circuit board 22. As a non-limiting example, the clamping element 34 (e.g. a housing) is disposed adjacent at least one of the decorative film 40, the non-conductive elastomer portion 18', and the conductive elastomer portion 20' to secure the conductive elastomer portion 20' in direct contact with a conductive portion 35 of the circuit board 22. It is understood that the direct contact between the conductive elastomer portion 20' and the conductive portion 35 of the circuit board 22 alleviates the requirement for a separate electrical interconnect device. However, it is understood that any means for electrical interconnection can be used to electrically couple the conductive elastomer portion 20' to the controller 16 and/or the circuit board 22.

The proximity sensors 12, 12' of the present invention include a non-conductive elastomer portion 18, 18' and a conductive elastomer portion 20, 20' cooperating to sense a touch of a user, wherein the proximity sensors 12, 12' represents a plurality of controlled trigger events. A sensing zone of the proximity sensors 12, 12' is maintained in a desired location. The proximity sensors 12, 12' provide for the use of a decorative visible surface, wherein the performance of the proximity sensors 12, 12' is maximized and options for producing a desired aesthetic appearance are maximized.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. A capacitive sensor comprising:
    a conductive elastomer portion to sense a touch of a user within a sensing zone of the conductive elastomer portion;
    a non-conductive elastomer portion formed into a predetermined shape disposed adjacent the conductive elastomer portion, wherein at least a portion of the non-conductive elastomer portion is within the sensing zone of the conductive elastomer portion; and
    a controller in electrical communication with the conductive elastomer portion to detect a change in capacitance of the conductive elastomer portion.

2. The capacitive sensor according to claim 1, wherein the controller initiates a first event in response to the change in the capacitance of the conductive elastomer portion exceeding a first threshold.

3. The capacitive sensor according to claim 1, wherein the controller triggers a second event in response to the change in the capacitance of the conductive elastomer portion exceeding a second threshold.

4. The capacitive sensor according to claim 1, wherein the non-conductive elastomer portion includes a decorative finish.

5. The capacitive sensor according to claim 1, further comprising a circuit board in electrical communication with the conductive elastomer portion and the controller to provide electrical intercommunication between the conductive elastomer portion and the controller.

6. The capacitive sensor according to claim 5, wherein the conductive elastomer portion abuts a conductive portion of the circuit board to provide electrical communication between the conductive elastomer portion and the circuit board.

7. The capacitive sensor according to claim 5, further comprising a clamping structure disposed adjacent at least one of the conductive elastomer portion and the non-conductive elastomer portion to secure the conductive elastomer portion in direct contact with a conductive portion of the circuit board.

8. A capacitive sensor comprising:
    a conductive elastomer portion to sense a touch of a user within a sensing zone of the conductive elastomer portion;
    a non-conductive elastomer portion formed into a predetermined shape disposed adjacent the conductive elastomer portion, wherein at least a portion of the non-conductive elastomer portion is within the sensing zone of the conductive elastomer portion;
    a controller in electrical communication with the conductive elastomer portion to detect a change in an electrical characteristic of the conductive elastomer portion; and
    a circuit board in electrical communication with the conductive elastomer portion and the controller to provide electrical intercommunication between the conductive elastomer portion and the controller, wherein the conductive elastomer portion abuts a conductive portion of the circuit board to provide electrical communication between the conductive elastomer portion and the circuit board.

9. A capacitive sensor comprising:
    a conductive elastomer portion to sense a touch of a user within a sensing zone of the conductive elastomer portion;
    a non-conductive elastomer portion formed into a predetermined shape disposed adjacent the conductive elastomer portion, wherein at least a portion of the non-conductive elastomer portion is within the sensing zone of the conductive elastomer portion;

a controller in electrical communication with the conductive elastomer portion to detect a change in an electrical characteristic of the conductive elastomer portion;

a circuit board in electrical communication with the conductive elastomer portion and the controller to provide electrical intercommunication between the conductive elastomer portion and the controller; and a clamping structure disposed adjacent at least one of the conductive elastomer portion and the non-conductive elastomer portion to secure the conductive elastomer portion in direct contact with a conductive portion of the circuit board.

* * * * *